United States Patent [19]

Smallcombe et al.

[11] Patent Number: 5,867,410
[45] Date of Patent: *Feb. 2, 1999

[54] TIME CORRECTION FOR DIGITAL FILTERS IN TRANSIENT MEASURMENTS

[75] Inventors: Stephen H. Smallcombe, Redwood City; Steven L. Patt, Cupertino, both of Calif.

[73] Assignee: Varian Associates, Inc., Palo Alto, Calif.

[ * ] Notice: The term of this patent shall not extend beyond the expiration date of Pat. No. 5,652,518.

[21] Appl. No.: 723,967

[22] Filed: Sep. 27, 1996

[51] Int. Cl.⁶ .............................. G06F 17/10; G01V 3/00
[52] U.S. Cl. .................................. 364/724.011; 324/307; 324/318
[58] Field of Search ........................ 364/724.01, 724.18, 364/724.16, 724.19, 724.2, 724.011; 324/307, 309, 322, 300, 314, 318

[56] References Cited

U.S. PATENT DOCUMENTS

| 4,835,689 | 5/1989 | O'Donnell | 250/580 |
| 5,170,123 | 12/1992 | Holland et al. | 324/322 |
| 5,393,982 | 2/1995 | Mott et al. | 250/370.06 |
| 5,529,068 | 6/1996 | Hoenninger, III et al. | 600/407 |
| 5,650,954 | 7/1997 | Minuhin | 364/825 |
| 5,652,518 | 7/1997 | Wuvl | 324/322 |

*Primary Examiner*—Emmanuel L. Moise
*Attorney, Agent, or Firm*—Edward Berkowitz

[57] ABSTRACT

Observation of transient phenomena in an oversampled regime is implemented with a time correction obtained by prepending one or more pseudo datums to the oversampled data to constitute an effective negative delay for the oversampled data set including the pseudo datums. For an oversampling factor N and oversampling rate $\omega_s$, a digital filter furnishes downsampled data uniformly spaced in time by $N/\omega_s$ and positioned at n $(N/\omega_s)$ where n is the discrete downsampled time coordinate.

5 Claims, 5 Drawing Sheets

TIME CORRECTION FOR DIGITAL FILTERS IN TRANSIENT MEASURMENTS

FIELD OF THE INVENTION

This invention is in the field of digital signal processing methods and particularly relates to digital signal processing of signals acquired in nuclear magnetic resonance (NMR) and like spectral measurements.

BACKGROUND OF THE INVENTION

Progressively higher resolution NMR measurement demands higher signal to noise performance and a baseline free-of artifact and distortion. A known methodology for obtaining improved signal to noise performance involves the sampling of time domain waveforms at a rate in excess of twice the rate corresponding to the highest frequency component of interest in the waveform. This higher than required (oversampling) rate $\omega_s$ increases the spectral width proportionately and causes the uncorrellated noise, or noise from broadband sources to be spread over a wider bandwidth. Only a relatively narrow portion of this expanded bandwidth contains the data of interest. Were the expanded bandwidth to be directly accomodated, the requirement for both memory and time for effecting the Fourier transformation would become impractical or prohibitive. Alternately, and preferably, the oversampled data is subject to a digital filter which returns a single datum from a plurality of oversampled data through convolution of the oversampled data with a selected filter function. Digital filter theory and practice are well known to the artisan.

In the prior art, the use of digital filters commonly introduces artifact and/or distortion to the spectral baseline. An origin for this effect is recognized in the time delays associated with filters which operate upon the time domain waveform. For example, a digital filter fuctions initially without the requisite history of oversampled data upon which to operate. U.S. Pat. No. 5,652,518, commonly assigned and incorporated herein by reference, treats this initial lack of data with use of pseudodata derived from the filter function to achieve a real-time digital filter exhibiting reduced baseline distortion.

It is known in the prior art to reduce baseline distortion arising from the transient ringing response of the filter. The analog filter also exhibits a finite response time. In the prior art baseline distortion was reduced by arranging the time of acquisition of data (specifically, the second datum acquired) in the vicinity of such transient response so as to avoid the transient filter response and acquire all data commencing with the second point on the flat (unity gain) portion of the filter characteristic, and by commencing data acquisition with the first sampling point representing the true time origin of the impulse, which has, in fact, been delayed by the receiver and analog filters therein.

SUMMARY OF THE INVENTION

In one aspect of the invention, prepending one or more pseudo datums to the oversampled data set establishes a time origin for the time domain waveform which closely approaches the physical time origin for the acquired spectrum as such origin is delayed by the observation apparatus.

In another aspect of the invention a combination of a fine delay before initial digital conversion and an effective negative delay of the signal acquisition permits precise alignment of downsampled data with a predetermined time coordinate set.

In yet another aspect of the invention, the effective negative delay in data acquisition is obtained by prepending pseudo datums to data acquired at oversampling rate $\omega_s$ to align each of n subsets of N oversampled data samples with a corresponding downsampled time coordinate $nN/\omega_s$.

DETAILED DESCRIPTION OF THE INVENTION

Figure 1:
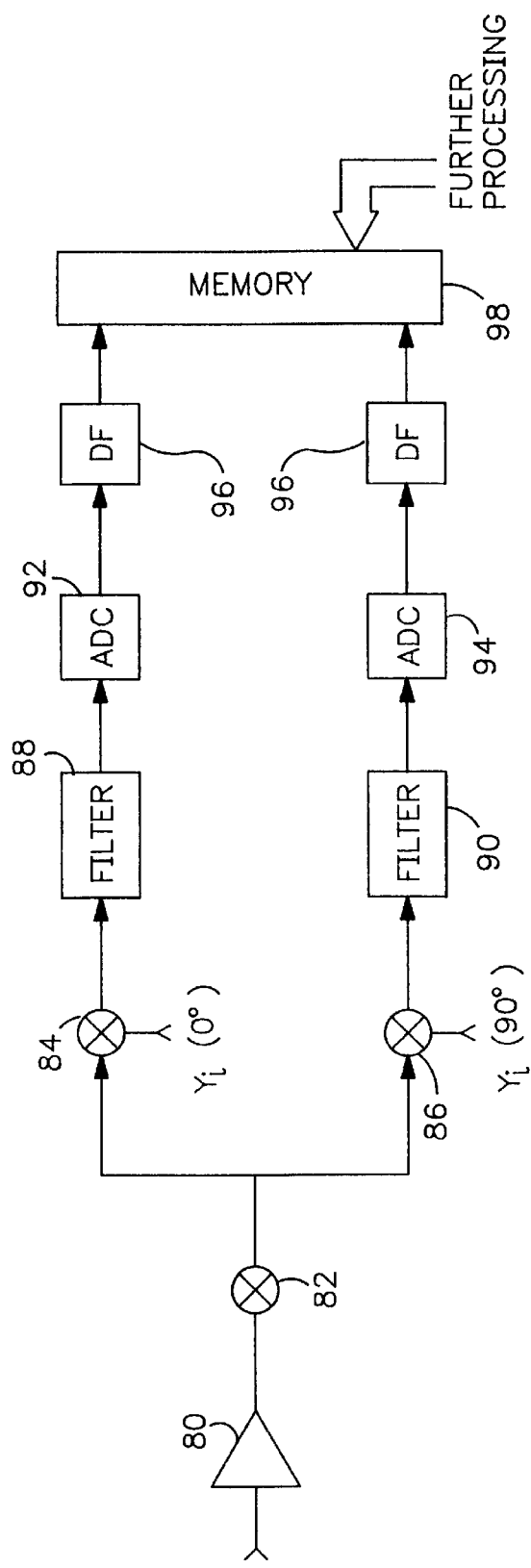
FIG. 1 is an illustration of the context of the invention.

FIG. 1 describes one particular instrumental context of the invention at the signal processing level close to the invention. An RF signal is derived from the NMR probe, which may include suitable pre-amplification, and is directed through amplifier 80 to mixer 82 where a local oscillator signal is mixed to yield a reduced intermediate frequency (IF) signal. The reduced frequency signal is split and directed in parallel paths to respective phase sensitive detectors 84 and 86 to yield respective quadrature related components. These signal components are subject to low pass filters 88 and 90 and then processed by respective ADCs 92 and 94. At this point, the digital filter 96, effectuated by a digital processor (not shown) operates upon each datum as it becomes available at the output of the component ADCs 92 and 94. Following the digital filter, the datum is recorded in memory 98 for subsequent time averaging and/or processing via the host computer, not shown. Logic apparatus, not shown, is employed to enable various components (such as ADCs 92 and 94, amplifier 80, etc.) at desired times. Although FIG. 1 illustrates an exemplary arrangement employing quadrature detection, the invention is not so limited.

Any filter has the potenial property of producing a delay for the signal propagating therethrough. An analog filter may be regarded as implementing a corresponding delay line. (In the prior art, digital filters also incur a charge-up, or initialization delay through the requirement of the acquisition of sufficient data to commence the processing of that data before the digital filter may emit its processed output.) For the situation where oversampling is practiced, the low pass filters 88 and 90 are designed to pass the highest frequency in the range corresponding to the oversampling rate. (For the purposes of this work, it is immaterial whether the filter function resides in the general receiver apparatus or in particular specific components. The phrase "analog filter" is here employed to distinguish the digital filter.) This produces a bandwidth much broader than the narrow bandwidth of interest which will result from operation of the digital filter. Delay is introduced principally by the analog filters 88 and 90. It will at once be apparent that the various delays of whatever source contribute to a phase shift with respect to coherent physical phenomena commencing with the excitation pulse. For the case of NMR, such pulse initiates precession of nuclear spins. Observation is not usually possible physically concurrent with the pendency of the excitation pulse (for most spectrocopies). The acquisition of the data set is initiated after some selectable time interval which may be characterized by the nature of the physical phenomena and also by instrumental parameters. The time interval is selectable within limits depending upon the filter delay(s). In the particular case of coherent spectroscopies, if the data set commences with a datum which is delayed an integral multiple of the sampling period with respect to the center of the relevant excitation pulse there results a frequency dependent phase shift of $2\pi n$ (n, an integer). It is recognized that the choice n=0 is preferable, inasmuch as a frequency dependant phase shift of zero results.

It is recognized that the first datum of the time domain data set controls a dc level of the frequency spectrum and is easily correctable to adjust that dc level. In the present invention, the time at which the first measured datum is acquired is adjusted to remove distortion from the spectral baseline and to obtain a data set for discrete fourier transform that more accurtely reflects the correct time domain fourier integral.

Figure 2A:
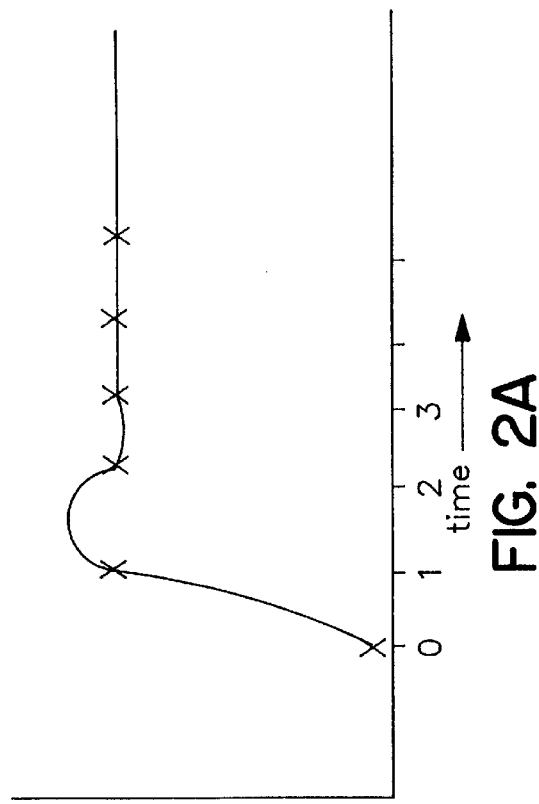
FIG. 2a shows a proper adjustment in data acquisition in respect to an analog filter per prior art.
Figure 2B:
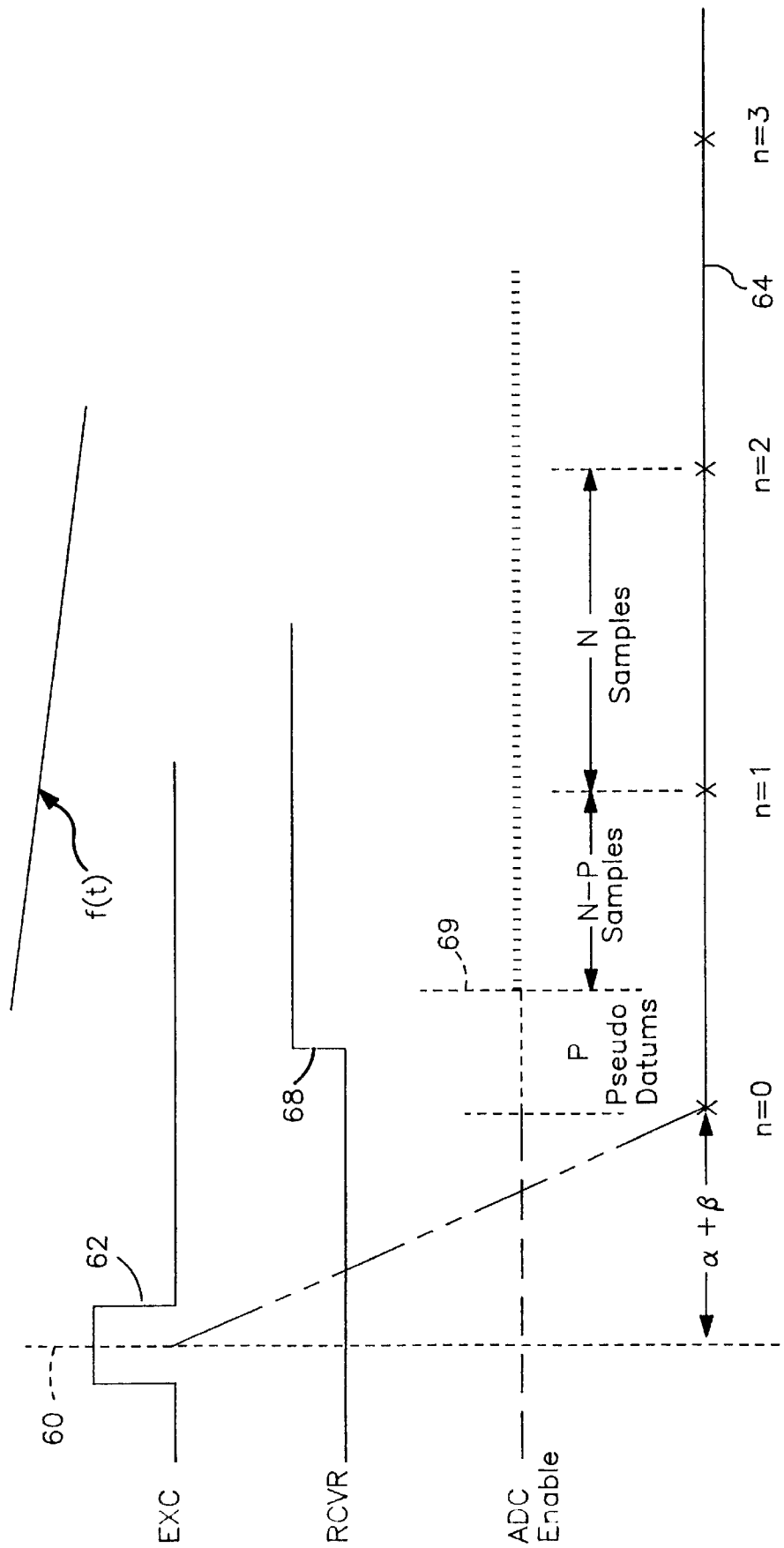
FIG. 2b shows a timing a diagram exhibiting further considerations for data timing.

Turning now to FIG. 2b, a general transient impulse phenomena f(t) may be regarded as having been initiated through excitation via pulse 60 which contains therein a physical time origin 62. A time axis 64 is defined by a precise time grid consisting of the downsampled point n=0 at time origin 62 and subsequent downsampled points n=1, n=2, n=3, . . . and this grid is defined to exhibit uniform spacing in time by amounts $n*(N/\omega_s)$ where $\omega_s$ is the sampling rate in an oversampling regime and N is the oversampling factor. As shown this grid is delayed in respect to the physical event defining the physical time origin. For coherent phenomena such as NMR, it is conventional to regard this grid as uniformly spaced in time by an interval equal to the effective sampling period of the downsampled spectral width. Associating waveform samples with these points leads to frequency spectra which may require no frequency dependent phase correction, if the first such point represents the datum corresponding to the the true time origin.

The measurement of general transient phenomena assumes some receiver-filter-digital converter arrangement further including a digital filter ("receiver") for downsampling the oversampled data. In the general case, the receiver is necessarily inoperative for a time interval during which the excitation pulse is active in order to protect the receiver from overload. Real systems usually provide additional time for ringdown from the excitation pulse. Thus the receiver cannot become active until after an earliest time shown as a time coordinate 68 for the case where this discrete time occurs before the first fiducial time (phase) point n=0. The time interval after which oversampled data appears at the output of the analog filter includes propagation delay through all circuitry in the signal path, (principally due to the analog filter). This constitutes a minimum delay $\beta$. An executable selectable delay $\alpha$ is provided to add fine timing adjustment capability. It is convenient to effectuate this selectable interval as a delay (which is the sum of $\alpha+\beta$) executed before issuing a conversion command to the ADC 92 or 94.

Thus, the physical time origin 60 maps to a physically later time marked as n=0 on the time axis 64. This displacement represents propagation delay through circuits in the signal path. One requirement of the present work is to correctly align the data acquisition activity with the downsampled time grid n=1, n=2, . . . Although the physical time origin may be associated with a point very nearly midway through the excitation pulse, direct observations cannot be made during this interval for NMR experiments in particular, as well as for most common transient impulse phenomena. In general, time domain measurement of the value of the first point acquired in the time domain is recognized to affect the resulting transformed frequency distribution as a constant ordinate offset. Error in the measurement of this point is easily corrected. Error in the second and subsequent points of the data set will be manifest as higher moments of the transformed distribution. In accord with prior art, if the second and subsequent (downsampled) points of the data set are timed to satisfy a synchronous relationship with the discrete time grid 64, typically through adjustment of delay $\alpha$, the contributions of phase error to the baseline of the spectra will be minimized. The first data point would also fall on this grid at n=0 if conditions would permit the early initiation of the oversampling procedure. However, the first point to be downsampled often cannot be obtained from N oversampled points because the overriding need is to assure that the second and subsequent points are properly aligned and as a consequence, the number of oversampled points associated with the first downsampled point is deficient. In the present work it has been discovered that the deficiency of some number of p oversampled points is successfully remedied by the addition to N–p measured points of p pseudo values to provide the weighting for a complete subset of N oversampled datums.

It is a premise for this work that data representing an early portion of the oversampled waveform cannot be acquired by straightforward technique because the required receiver quiescence limits the time when when sampling may begin. The signal propagation delay $\beta$ is not a limiting parameter for acquisition of a fully oversampled first (downsampled) datum because data is not lost, but simply, delayed. This condition is common for oversampling at a relatively high bandwidth. If it were possible to do so, it would be desirable to commence data acquisition earlier than permitted by the necessary quiescent state of the receiver and the delay through the analog filter. Accordingly, in the present invention a negative delay is introduced by advancing the apparent time at which data acquisition begins. This is accomplished through the agency of prepending pseudo datums to the list of acquired waveform samples. These pseudo datums occur earlier than the actually acquired first oversampled datum and are assigned a value close to the measured ordinate for the respective first acquired (oversampled) datum. Alternatively, the value assigned is obtained by extrapolation from some appropriate plurality of samples measured. In another alternative, the assigned value may be zero.

Figure 3A:
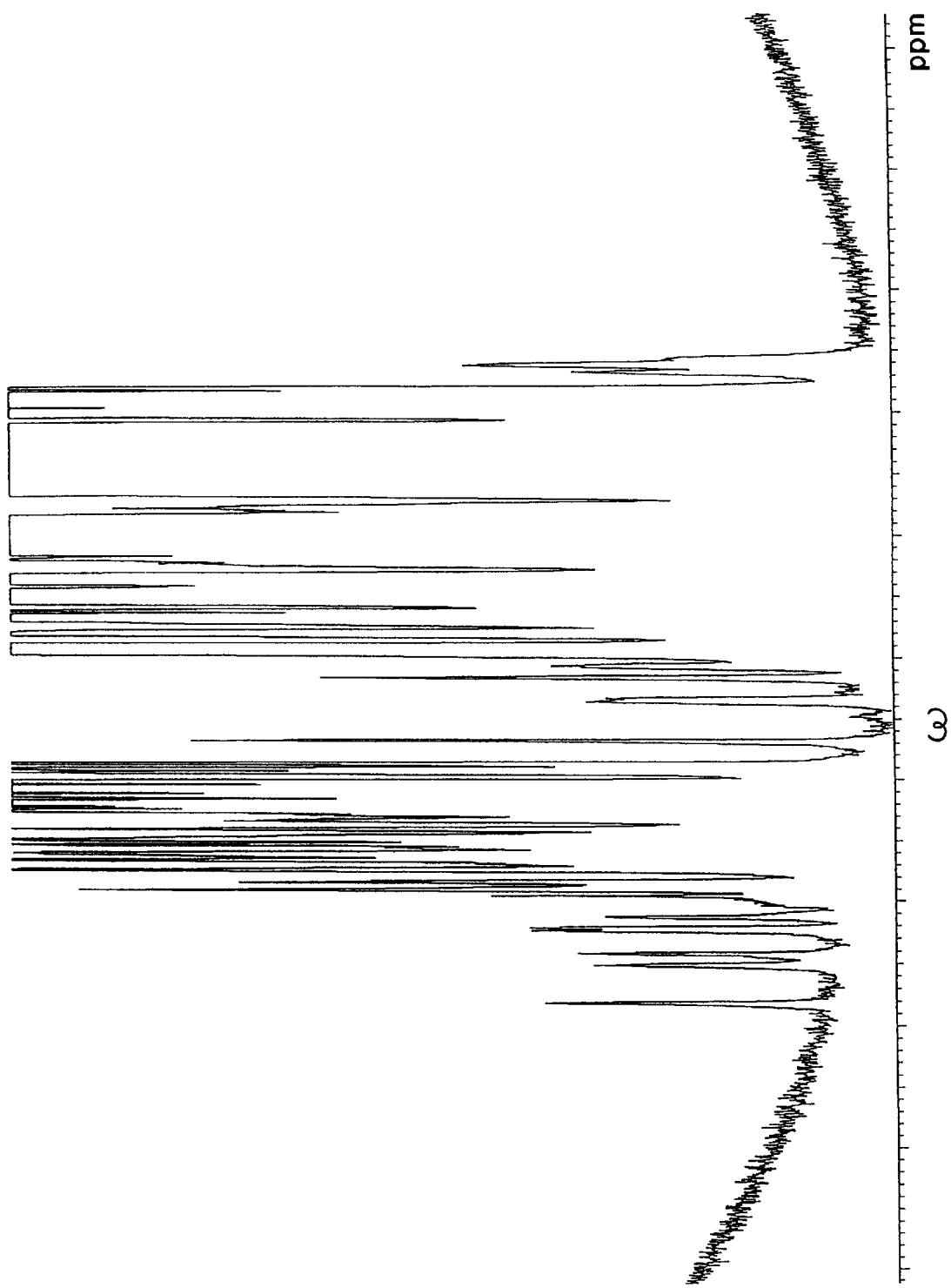
FIG. 3a is a representative spectrum exhibiting distorted baseline.
Figure 3B:
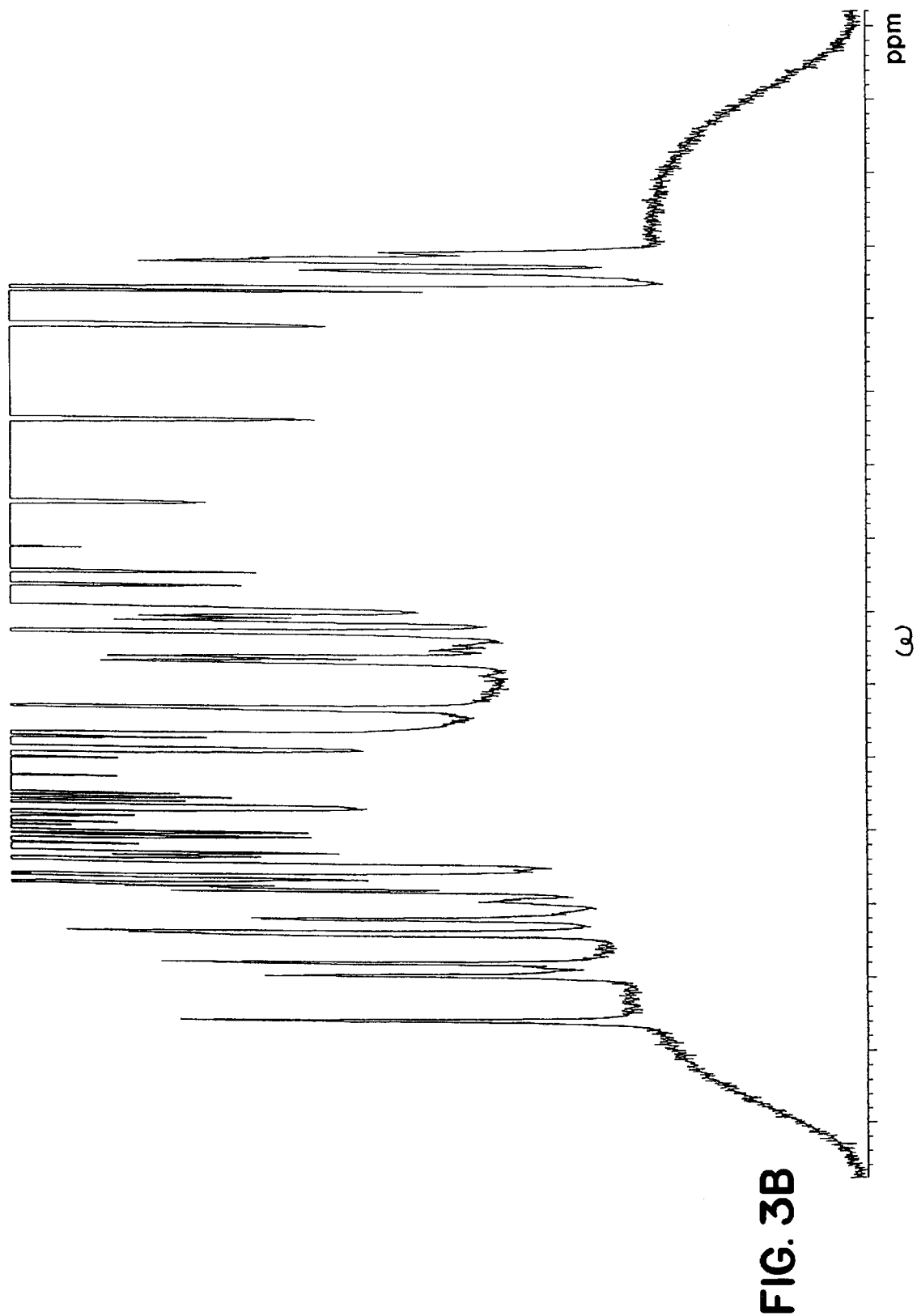
FIG. 3b is the same as FIG. 3a with different baseline distortion.
Figure 3C:
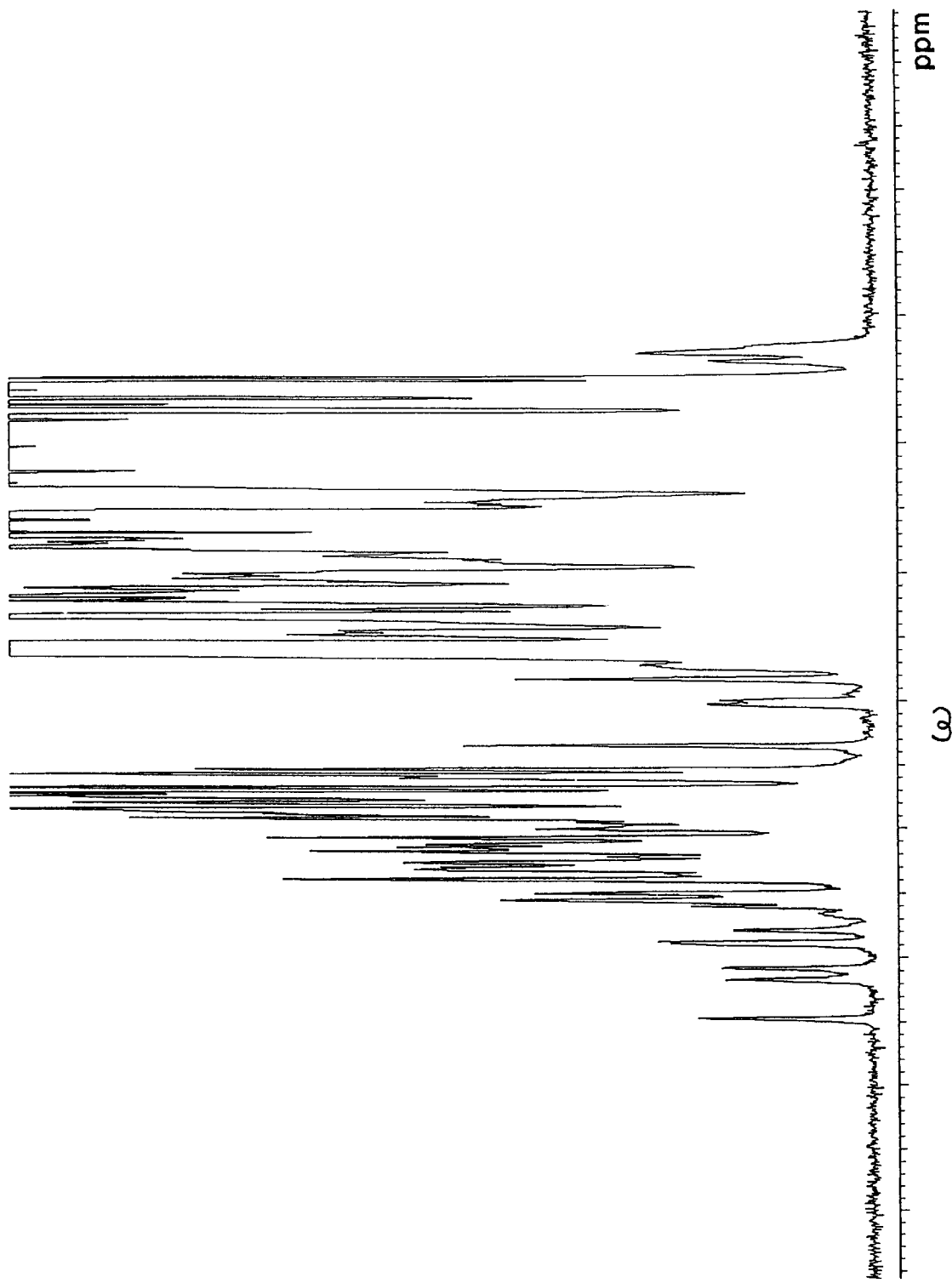
FIG. 3c is the same as FIGS. 3a and 3b using the timing correction method of the present invention.

It is instructive to consider the frequency spectra of FIGS. 3a and 3b. The sample is a protein, specifically 8-mM BPTI in 90% $H_2O$ acquired on a 400 MHz Varian NMR spectrometer. In both figures the identical oversampling rate (25) and digital filter are employed. The vertical scale is suppressed to aid study of the baseline. For the case of FIG. 3a, the data acquisition commences after a delay from physical time origin 60 of magnitude sufficient for the earliest emergence of the signal at the analog filter output at time (close to time 69). The spectrum of FIG. 3b was obtained by commencing waveform sampling close to time 68 with the gating of the receiver (which occurs at the earliest practical time from the point of view of receiver protection). The baseline artifact is here due to acquisition of oversampled data at a time before the analog filter output presents valid data. Both spectra exhibit unacceptable baselines. The time indicia in each of these examples is not synchronous with the desired downsampled time grid n=0, 1, 2, .... Without the time correction of the present work, the digital filter may introduce a serious baseline artifact. In FIG. 3c, the time correction of the present invention is incorporated to align the data table inclusive of p pseudo datums to produce a satisfactory flat baseline exhibiting no frequency dependent phase shift. The pseudo datums introduced provide precise synchrony to the downsampled first point. To the extent that these artificial data affect the precise ordinate of the first down sampled point, that error is a simple dc offset and easily corrected. The error is not massive if the sampled function f(t) is slowly changing, that is, the time derivative of f(t) is small compared with $1/\omega_s$, and the number of pseudo points is small compared with the oversampling factor N.

Although the example of NMR data has been used, the invention disclosed herein is not limited to the field of NMR. Any digital filter downsampling operation for processing impulse data may profitably employ the invention.

It will be appreciated by those of ordinary skill having the benefit of this disclosure that the illustrative embodiments described above are capable of many variations without departing from the scope and spirit of the invention. Accordingly, the exclusive rights sought to be patented are as described below.

What is claimed is:

1. The method of establishing a processed data table of M values derived from K oversampled quantities representing an impulse response for subsequent transformation to the frequency domain, comprising, (a) exciting impulse phenomena at a time proximate $t_0$, (b) after a quiescent time $t_0+t_q$, directing a waveform through a receiver and an analog filter to pass the frequency content of oversampled data therethrough, (c) sampling said waveform to an ADC at an oversampling rate $\omega_s$ to obtain first and subsequent samples, whereby each said sample experiences a delay in propagation through said receiver, analog filter and ADC, and whereby a list of said samples at respective discrete abscissa values are established at uniform intervals of $N/\omega_s$ commencing at a delay time $\tau_d$ after $t_0+t_q$, where N is a selected positive integer (d) prepending to said list as many as p pseudo datums at abscissa values $-p/\omega_s$ with respect to $t_0+t_q+\tau_d$ said the prepended list being aligned with a time coordinate $t_0+n(N/\omega_s)$ and n is a positive integer representing the downsampled time coordinate.

2. The method of claim 1 wherein $p/N \ll 1$.

3. The method of claim 1 wherein the ordinate value of said pseudo datums is the same as the value obtained for said first sample.

4. The method of claim 1 wherein the ordinate value of said pseudo datums is extrapolated from some plurality of early acquired samples.

5. The method of claim 1 wherein the ordinate value of said pseudo datums is zero.

* * * * *